Jan. 28, 1958 J. N. CARMAN, JR 2,821,493

FUSED JUNCTION TRANSISTORS WITH REGROWN BASE REGIONS

Filed March 18, 1954

INVENTOR.
BY JUSTICE N. CARMAN JR.,
Seymour M. Rosenberg
HIS ATTORNEY.

United States Patent Office 2,821,493
Patented Jan. 28, 1958

2,821,493

FUSED JUNCTION TRANSISTORS WITH REGROWN BASE REGIONS

Justice N. Carman, Jr., Woodland Hills, Calif., assignor to Hughes Aircraft Company, Culver City, Calif., a corporation of Delaware Application March 18, 1954, Serial No. 417,081

4 Claims. (Cl. 148—1.5)

This invention relates to fused junction transistors with regrown base regions, and more particularly to fused junction transistors in which the base region is produced by converting to one conductivity type a region of a semiconductor starting specimen of the opposite conductivity type.

Relatively recent advances in the semiconductor art have brought forth a new type of semiconductor triode, or transistor, which is designated by the term "junction transistor." The emitter and collector rectifying barriers in this type of transistor are produced by creating alternate regions of opposite conductivity-type semiconductor material in a continuous solid crystal specimen of monatomic semiconductor material.

The term "monatomic semiconductor material," as utilized herein, is considered generic to both germanium and silicon and is employed to distinguish these semiconductors from ionic semiconductors, such as copper oxide. Although the invention will be disclosed with particular reference to germanium, it is to be expressly understood that silicon may also be employed in the fused junction transistors of the present invention.

In the semiconductor art, a region of monatomic semiconductor material, containing an excess of donor impurities and yielding an excess of free electrons is considered to be an N-type region, while a P-type region is one containing an excess of acceptor impurities resulting in a deficit of electrons, or stated differently, an excess of holes. When a continuous solid specimen of monatomic semiconductor material has two N-type regions separated by one P-type region, it is termed an N-P-N junction transistor, while a specimen having two P-type regions separated by one N-type region, for example, is termed a P-N-P junction transistor.

The term "active impurities" is used to denote those impurities in particular which affect the electrical rectification characteristics of monatomic semiconductor material, as distinguished from other impurities which have no appreciable effect upon these characteristics. Generally speaking, active impurities are added intentionally to substantially intrinsic semiconductor material, although in many instances certain of these impurities may be found in the semiconductor material in an intermediate stage of refinement. Active impurities are classified either as donors, such as phosphorus, arsenic, and antimony, or as acceptors, such as gallium, indium, and aluminum.

In the semiconductor art, both N-P-N and P-N-P junction transistors are usually produced by either of two well-known processes, namely, the crystal-pulling technique, wherein the junction transistor is grown by withdrawing a seed crystal from a doped melt of monatomic semiconductor material, and the fusion process, wherein two spaced regions on opposite ends of a semiconductor specimen of one conductivity type are converted to the opposite conductivity type.

According to the prior-art crystal-pulling technique, a seed crystal of semiconductor material of one conductivity type is withdrawn from a melt of the base semiconductor material, the constituency of which is changed during the crystal-growing process to produce at least the last grown P-N junction in the device. For example, to produce an N-P-N junction transistor, an N-type seed crystal is brought into contact with a melt of P-type germanium containing an impurity of the acceptor type and is then withdrawn from the melt at such a rate as to maintain a substantially planar boundary between the growing solid crystal and the liquid melt. When the crystal has grown to include a region of P-type germanium having a thickness of the order of .001 of an inch, the melt is doped with an active impurity of the donor type in sufficient quantity to convert the melt to N-type germanium. Thereafter, as the crystal continues to grow, a second region of N-type germanium is produced, this region including both acceptor and donor impurities, since the original acceptor impurities cannot be removed from the melt during the crystal-growing process.

This prior-art method of producing junction transistors has several inherent limitations. Firstly, the method is not readily adapted to mass production because of the relatively slow rates at which the crystal must be drawn and the relatively precise process controls required to regulate the thickness of the base region and to prevent the formation of lattice defects in the crystal. Secondly, numerous difficulties are encountered in locating and ohmically connecting a base electrode to the relatively thin base region. Thirdly, the base impedance of this type of transistor is usually relatively high in comparison with the base impedance of junction transistors produced by the fusion process. In addition, the frequency response of the transistors produced by this prior-art method is relatively low in comparison with point-contact transistors, for example.

According to the prior-art fusion process for producing junction transistors, two spaced regions of a semiconductor specimen of one conductivity type are converted to the opposite conductivity type by fusing an active impurity, either alone or in alloy form, to opposite surfaces of the starting specimen. The unconverted portion of the starting specimen thereafter constitutes the base region of the transistor, while the two newly formed regions of opposite conductivity-type material constitute the emitter and collector regions, respectively, and are separated from the base region by the emitter and collector rectifying barriers, respectively.

Several preferred methods for producing both N-P-N and P-N-P junction transistors by the fusion process are disclosed in copending U. S. patent applications, Serial No. 303,626, for "Junction-Type Semiconductor Devices," by S. H. Barnes et al., filed August 9, 1952, and Serial No. 393,038, for "Fused Junction Semiconductor Devices," by J. N. Carman et al., filed November 19, 1953. According to one method for producing a germanium N-P-N junction transistor, for example, two pellets of lead-arsenic alloy are first prefused to opposite surfaces of a P-type germanium starting specimen. Thereafter, the combination is heated to a predetermined value of temperature above the melting point of the alloy, but below the melting point of the germanium, to melt the alloy pellets and to dissolve therein a predetermined amount of the adjacent starting specimen, thereby creating two molten alloy regions of lead, arsenic, and germanium on the opposite surfaces of the specimen. The combination is then cooled at a predetermined rate to precipitate or redeposit onto the adjacent starting specimen a portion of the dissolved germanium, together with substituted atoms of arsenic, thereby producing two regrown regions of N-type germanium which constitute the emitter and collector regions, respectively.

Although this fusion process has proven eminently successful for producing junction transistors, it has several limitations. Firstly, although the thickness of the base region may be controlled by carrying out the fusion operation on a specimen of predetermined size and by controlling the depth of penetration of the molten pellets into the specimen, this thickness may vary from transistor to transistor by distances of the order of several ten thousandths of an inch. Secondly, the resistivity of the base region is relatively high, since the starting specimen was relatively high-resistivity material and the base region is that portion of the starting specimen which remains unchanged during the fusion operation. Accordingly, the transistor base resistance is relatively high, and therefore, limits the frequency response of the transistor.

The present invention, on the other hand, provides a novel fused-junction high-frequency transistor which overcomes the above and other disadvantages of the prior-art junction transistors. According to the basic concept of the invention, fused junction transistors include a base region created by converting a portion of a semiconductor starting specimen of one conductivity type to the opposite conductivity type, the unchanged portion of the starting specimen constituting the collector region. The emitter region and its associated junction are then formed on the opposite or exposed surface of the base region by either a second fusion operation, or by electroforming therewith a conventional wire whisker element.

More particularly, according to a preferred method of the invention, one region of a semiconductor starting specimen of one conductivity type is converted to a base region of the opposite conductivity type by carrying out a fusion operation similar to that disclosed in the above-mentioned copending application Serial No. 393,038 to Carman et al., the fusion process being controlled so as to produce a regrown region of a precise and predetermined thickness and relatively low resistivity. The alloy button which freezes out atop the regrown region at the end of the fusion operation is then dissolved in a suitable solvent, after which an emitter P–N junction is formed with the regrown region by employing, for example, an active-impurity-doped wire whisker element of the type disclosed in copending U. S. patent application, Serial No. 306,014, for "Point-Contact Semiconductor Devices and Methods of Making Same," by J. N. Carman et al., filed August 23, 1952. On the other hand, the emitter region may be created by fusing to the regrown region a second and smaller alloy pellet, including an active impurity of the type opposite to the predominant active impurity in the base region.

It will be recognized from the detailed description set forth hereinbelow that the methods of the present invention are applicable to the production of both N–P–N and P–N–P transistors. Owing to the relatively precise control which may be exercized over the thickness of the regrown base region by carrying out the methods of the invention, transistors with relatively thin base regions of the order of a fraction of a mil may be readily produced. Consequently, the transit time required for injected carriers to cross the base region is relatively short. In addition, the growth of the base region by precipitation from a liquid phase, which includes a significant percentage of an active impurity, produces relatively low-resistivity material in the base region, thereby providing a transistor having a relatively low base resistance. Accordingly, the frequency response of the junction transistor of this invention is relatively high, while power dissipation in the base region is significantly decreased.

It is, therefore, an object of this invention to provide high-frequency fused junction transistors having regrown base regions of relatively low resistivity.

Another object of this invention is to provide fused junction transistors in which the base regions are created by converting to one conductivity type a region of a semiconductor specimen of the opposite conductivity type.

It is also an object of this invention to provide fused junction transistors in which the base region is regrown onto the collector region by fusing an alloy pellet to the collector region.

An additional object of this invention is to provide fused junction transistors in which the base region is created by converting a portion of a semiconductor starting specimen of one conductivity type to the opposite conductivity type and in which the emitter region is created by reconverting a portion of the base region back to the original conductivity type.

Still another object of this invention is to provide fused junction transistors in which a relatively thin low-resistance base region is created by fusing to a semiconductor specimen of one conductivity type an alloy pellet, including an active impurity of the type opposite to that determining the conductivity type of the starting specimen.

It is an additional object of this invention to provide methods for producing fused junction transistors by converting a portion of a semiconductor specimen of one conductivity type to the opposite conductivity type to create a relatively thin, low-resistance base region.

It is another object of this invention to provide methods for producing fused junction transistors by converting a portion of a semiconductor specimen of one conductivity type to the opposite conductivity type to create a regrown base region, and subsequently forming an emitter junction with the base region by electroforming thereto a whisker element.

A further object of this invention is to provide methods for producing fused junction transistors by converting a region of a semiconductor specimen of one conductivity type to the opposite conductivity type and by subsequently reconverting a portion of the region of said opposite conductivity type back to its original conductivity type.

The novel features which are believed to be characteristic of the invention, both as to its organization and method of operation, together with further objects and advantages thereof, will be better understood from the following description considered in connection with the accompanying drawings in which several embodiments of the invention are illustrated by way of examples. It is to be expressly understood, however, that the drawings are for the purpose of illustration and description only, and are not intended as a definition of the limits of the invention.

Figure 1:
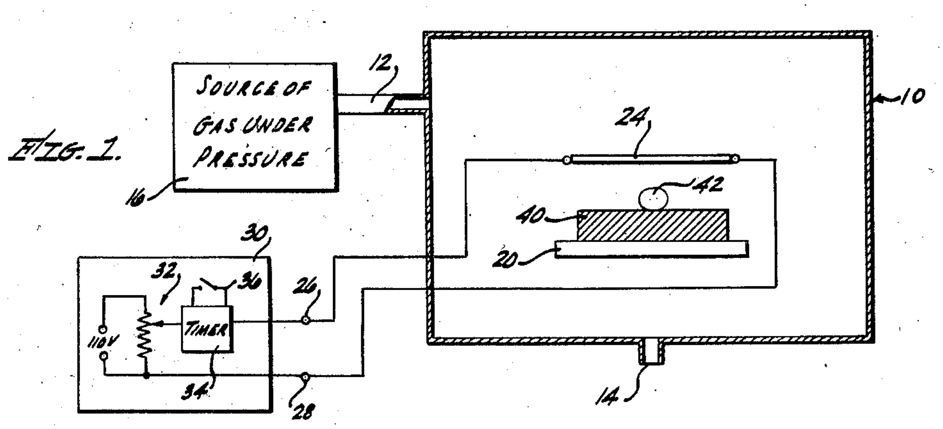
Fig. 1 is a schematic diagram, partly in section, of one form of apparatus for carrying out an intermediate step in the production of fused junction transistors according to the present invention.

Referring now to the drawings, wherein like reference characters designate like or corresponding parts throughout the several views, there is shown in Fig. 1 one form of apparatus for carrying out one of the operational steps in the method of producing transistors according to the invention. More particularly, the apparatus is employed for producing the regrown base region of the transistor and comprises a heating chamber 10, having an intake port 12 and an exhaust port 14, the intake port being coupled to a source 16 of gas under pressure. Positioned within chamber 10 is a crystal platform 20, preferably constructed of molybdenum or stainless steel, and supported within chamber 10 by a suitable supporting device, not shown for purposes of clarity. The apparatus also includes a heater element 24 which is positioned adjacent platform 20 and is coupled without chamber 10 to two output terminals 26 and 28, respectively, of an electrical power source 30.

Electrical source 30 may include any conventional electrical circuit which is controllable for supplying a predetermined amount of electrical energy to heater element 24. As shown in Fig. 1, for example, power source 30 includes a rheostat, generally designated 32, which is connected across a 110-volt alternating-current source, not shown, and to a timer 34 which is energizable by a switch 36 for applying the potential output from rheostat 32 to heater element 24. Timer 34 may be any conventional electronic or electro-mechanical timing mechanism which is actuable for closing an associated electrical circuit for a predetermined time interval. Since numerous timers of this type are well known to the art, further description of timer 34 is considered unnecessary.

For purposes of illustration the operation of the apparatus shown in Fig. 1 will be described with respect to the production of a P-N-P fused junction transistor according to the invention. It will be recognized, however, that the identical operational steps to be described may also be employed for producing N-P-N junction transistors, according to the invention. It will also be recognized that the methods employed for producing the transistor base region are similar to those set forth in the aforementioned copending application Serial No. 393,038 for producing the emitter and collector regions in the conventional type of fused junction N-P-N transistors.

In operation, a P-type germanium starting specimen 40 is first positioned on crystal platform 20 adjacent heater element 24. Specimen 40 is preferably a germanium single crystal which has been crystallographically oriented so that its upper and lower surfaces, as shown in Fig. 1, are the (111) surface planes of the crystals. Crystallographically orienting the specimen is considered desirable to insure the growth of planar P-N junctions within the specimen during the fusion operation described hereinbelow. It appears preferable to employ the (111) surface plane for carrying out the method of this invention, the theory being that the relatively high atomic density of the crystal on this particular plane permits better control of subsequent operations. It should be pointed out, however, that other relatively dense crystallographic surface planes, such as the (110), (100), and (112), may be employed satisfactorily in carrying out the method of the invention.

When specimen 40 has been properly positioned relative to heater element 24, an alloy pellet 42 is positioned on the upper surface thereof, substantially as shown, preparatory to creating the base region in the specimen. Alloy pellet 42 preferably contains at least two distinct constituents, namely, a solvent metal including at least one or more of the elements from the group consisting of mercury, lead, thallium, and bismuth, and an active impurity of the type opposite to that which determines the conductivity type of the germanium starting specimen. Assuming, therefore, that specimen 40 is P-type material including an acceptor impurity, alloy pellet 42 includes a donor impurity, such as arsenic, for example. A number of specific alloys which may be employed for producing P-N junctions by the fusion process are set forth in the above-mentioned copending applications to Barnes et al. and Carman et al.

After alloy pellet 42 has been placed upon specimen 40, chamber 10 is filled with a suitable gas, such as helium or hydrogen, from gas source 16 in order to surround the specimen with a dry non-oxidizing atmosphere, thereby preventing the formation of undesirable oxides or films during the subsequent steps in the methods of the invention. Switch 36 is then closed to supply electrical energy to heater element 26 to raise the temperature of pellet 42 and specimen 40 to a value of temperature above the melting point of the pellet, but below the melting point of germanium.

Consider now the physical phenomena occurring in the germanium specimen and its associated alloy pellet when switch 36 is closed. The application of heat from the heater element is sufficient to melt the alloy pellet, but is not sufficient to melt the specimen. However, the constituency of the pellet is selected to provide an alloy, which when molten, readily dissolves germanium. Accordingly, when the alloy pellet is melted, it dissolves the adjacent region of the germanium specimen and forms an alloy with the dissolved germanium.

After the molten alloy pellet has substantially reached equilibrium at the predetermined temperature and has dissolved the desired amount of germanium, the combination of the specimen and the dependent alloy region is then cooled at a predetermined rate to redeposit a portion of the dissolved germanium onto the adjacent P-type specimen, thereby producing a regrown region in the germanium crystal specimen. The donor impurity utilized in the pellet is selected so that its atomic diameter is similar to that of germanium, thereby permitting impurity atoms to substitute for germanium atoms in the regrowing portion of the crystal lattice. Consequently, sufficient donor atoms are incorporated in the regrown region of the crystal specimen to produce N-type germanium in this region, thereby providing the collector P-N junction in the transistor.

As the cooling process is continued, a value of temperature is reached whereat the remainder of the molten alloy of germanium, solvent metal, and donor impurity tends to solidify as an alloy button affixed to the regrown N-type region. Thus, as the specimen is cooled thereafter, the remainder of the molten alloy adjacent the regrown N-type region is solidified as an alloy button which is ohmically connected to the N-type region. It should be pointed out that the atomic diameter of the solvent-metal atoms employed in the alloy pellet is sufficiently large to preclude deposition of atoms of the solvent metal in the regrown region. Consequently, substantially all of the solvent metal in the original alloy pellet is included in the alloy button which freezes out adjacent the regrown region.

It has been found that the thickness of the regrown base region may be controlled by regulating two factors, namely, the depth of penetration of the alloy pellet into the germanium specimen, or in other words the amount of germanium dissolved, and the amount of dissolved germanium regrown onto the starting specimen during the cooling step. It has further been found that the amount of germanium dissolved by the alloy pellet is a function of the constituency of the alloy, the equilibrium temperature at which the fusion process is carried out, the mass of the alloy pellet, and the duration of the fusion process.

It is known, for example, that the solubility of a given element in a given melt at a given temperature may be determined from phase diagrams which correlate solubility and temperature for a given combination of constituents in equilibrium. It is also known that the amount of a given element which may be dissolved in a given melt at a given temperature is directly proportional to the amount of the original melt. In addition, it is known that if each of the other factors is constant the amount of material dissolved is an exponential function of time which approaches an equilibrium value in an asymptotic fashion and is relatively independent of the period during which heat is applied so long as the time constant of the exponential function is relatively small in comparison with this period.

It is clear, therefore, that the amount of germanium dissolved by the pellet may be readily controlled by regulating the size and constituency of the alloy pellet and the temperature to which the pellet is raised. Consequently, if the shape of the dissolved region in the germanium specimen is controllable, the depth of penetration of the dissolved region may also be controlled.

It has been found that the interface between the germanium specimen and the molten alloy may be maintained substantially planar if the germanium starting crystal is crystallographically oriented in the manner set forth hereinabove. In addition, it is known that a predetermined relationship exists between the depth of penetration and the cross-sectional area of the dissolved region for each specific alloy which may be employed, this relationship being a function of surface tension and other allied metallurgical phenomena. Consequently, the shape of the dissolved region is controllable, thereby assuring that the depth of penetration of the alloy pellet into the specimen may also be very accurately controlled.

Figure 2:
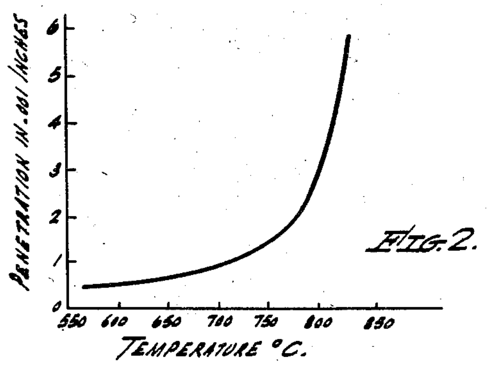
Fig. 2 is a curve illustrating the effect of temperature on one of the operational steps in the production of fused junction transistors according to the invention.

Referring now to Fig. 2, there is shown a generalized curve illustrating the relationship between the fusion temperature and depth of penetration for a three-milligram alloy pellet, including by-weight 97% lead and 3% arsenic. It will be noted that the alloy pellet dissolves germanium to a depth of approximately .001 of an inch at a fusion temperature of the order of 650° C. It should be understood, of course, that a separate curve may be plotted for each specific alloy which is utilizable for producing the regrown base region.

It may be recalled that the thickness of the regrown base region in the transistor produced according to the methods of this invention is a function of the amount of dissolved germanium precipitated back onto the starting specimen during the cooling process. It has been found that the percentage of the dissolved germanium which is redeposited onto the germanium starting specimen is a function of the rate at which the specimen is cooled, but is relatively constant if the cooling rate is not excessive. In practice, satisfactory regrown regions including of the order of 95% of the dissolved germanium or higher have been produced when the germanium specimen was cooled as slow as .5° C. per minute and as fast as several hundred degrees centigrade per minute.

It is clear from the foregoing discussion that if the cooling rate is sufficiently slow to redeposit substantially all of the dissolved germanium back onto the starting specimen, the precise temperature at which the fusion operation is carried out is the only critical parameter, and is determined in view of the size and constituency of the alloy pellets employed and the desired thickness of the regrown region. Inasmuch as all of the parameters are correlated, the precise value for each parameter is best determined empirically for each specific base region thickness desired. For example, a regrown base region .0005 of an inch thick may be produced by carrying out the fusion operation at approximately 610° C. using a 3 mg. alloy pellet, including 97% lead and 3% arsenic. To produce a thinner regrown region with the same alloy pellet, on the other hand, requires only that the fusion operation be carried out at a slightly lower temperature.

It should be pointed out that the cooling rate is also a significant parameter in determining the electrical characteristics of the completed transistor. It is known, for example, that to obtain high current gain ($\alpha$) in the completed transistor, the emitter efficiency should approach unity. To achieve reasonably high emitter efficiency, in turn, the semiconductor material in the regrown base region should have two characteristics. Firstly, the minority carrier lifetime in the base region should be sufficiently long so that the diffusion length of minority carriers is considerably larger than the thickness of the base region. In practice, the minority carrier lifetime in the regrown base region has been found to exceed two microseconds, thereby insuring that the diffusion length is relatively large in comparison with the base-region thickness.

The second characteristic required of the base-region material is that its resistivity be at least of the order of ten times the resistivity of the associated emitter region. In addition, the minimum base-region resistivity is limited by the fact that the resistivity of the emitter region should be sufficiently high to permit reasonably high minority carrier lifetime in the emitter region. Since resistivity is in general proportional to the active-impurity concentration, the resistivity of the base region is readily controllable by controlling the number of active-impurity atoms incorporated into the base region during the regrowth process.

It has been found that the active-impurity concentration in the regrown base region is a function of the rejection ratio of impurity atoms, that is the tendency of impurity atoms to remain in the liquid phase rather than to substitute for germanium atoms in the regrown base region, and the percentage of active impurity included in the alloy pellets, or in other words, the number of impurity atoms available to be incorporated into the regrown region. It is also known that the rejection ratio is a function of the temperature at which the fusion operation is carried out and the rate at which the semiconductor specimen is cooled thereafter, the rejection ratio decreasing as the temperature of the specimen decreases provided that the cooling rate is not excessive. Consequently, it will be recognized that the variation in rejection ratio during the cooling process will create a resistivity gradient in the regrown base region. In practice, it has been found that the resistivity of the base region may be maintained sufficiently high by employing in the fusion operation alloy pellets containing active impurities of the order of 3% or less, and by cooling the specimen at rates of the order of 10° C. per minute, as described hereinabove.

Figure 3:
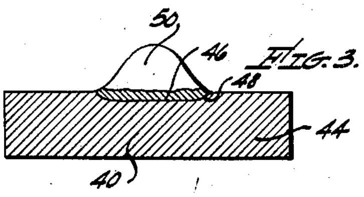
Fig. 3 is a sectional view of a transistor in an intermediate stage of production according to one method of the invention.

Referring now to Fig. 3, the results of performing the fusion operation upon specimen 40 are illustrated. The specimen now includes an unconverted region 44 of P-type germanium, constituting the collector region, and a regrown base region 46 of N-type germanium which is separated from P-type region 44 by a collector rectifying barrier 48. In addition, the transistor in this intermediate stage of production includes an alloy button 50 which is ohmically and mechanically connected to base region 46 and is composed of the remainder of the dissolved germanium and the elemental constituents of the original alloy pellet. The device is now preferably etched in any one of several suitable etchants known to the art to remove the germanium immediately adjacent the external periphery of the rectifying junction and thereby eliminate any short circuits which may have formed across the rectifying barrier during the formation of the P-N junction.

Figure 4:
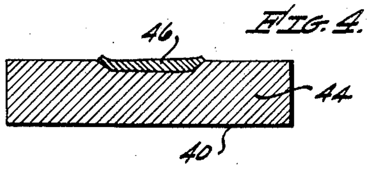
Fig. 4 is a sectional view of the transistor shown in Fig. 3 in a subsequent intermediate stage of production.

The next step in the production of the fused junction transistors of this invention is to remove alloy button 50 from base region 46. One technique which has been found satisfactory for performing this operation is to immerse the combination of specimen 40 and button 50 in a beaker of mercury heated approximately to 200° C. Owing to the relatively low solubility of germanium in mercury and the relatively high solubility in mercury of the solvent metal included in the alloy button, button 50 is dissolved by the mercury, while specimen 40 remains substantially unchanged. At the conclusion of this step, specimen 40, including collector region 44 and base region 46, appears as illustrated in Fig. 4.

The specimen is now etched once more to clean the upper surface of the regrown region. One of several etchants known to the art which is satisfactory for etching the specimen is a solution containing three parts 48% hydrofluoric acid, five parts concentrated nitric acid, five parts of glacial acetic acid, and 10 drops of liquid bromine for each fifty cubic centimeters of solution. At the conclusion of this step, the specimen is ready for the formation of the emitter rectifying barrier.

The formation of the emitter rectifying barrier in the transistors of the present invention may be accomplished in either of several manners. Firstly, a conventional whisker element may be brought into contact with the base region and electroformed therewith. On the other hand, a second and smaller alloy pellet may be fused to the base region to produce a regrown emitter region adjacent the base region.

Figure 5:
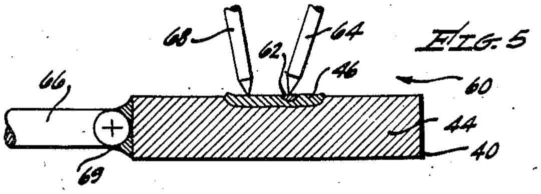
Fig. 5 is a schematic diagram, partly in section, of one embodiment of a fused junction transistor according to the invention in which the emitter region is created by electroforming a point-contact emitter to the base region.

Referring to Fig. 5, there is shown a P-N-P transistor, generally designated 60, produced according to the methods of this invention including a germanium specimen 40 having therein a collector region 44 of P-type germanium, a base region 46 of N-type germanium, and an emitter region 62 of P-type germanium. The emitter region in this embodiment of the invention is produced by electroforming a wire whisker element 64 with base region 46, the whisker element preferably including an active impurity of the type opposite to that determining the conductivity type of the base region. Assuming, as hereinabove, that the regrown base region is N-type germanium, the whisker element may be, for example, an indium-plated molybdenum whisker element of the type disclosed in copending U. S. application Serial No. 306,014 for "Point Contact Semiconductor Devices and Methods of Making Same," by Justice N. Carman, Jr. et al., filed August 23, 1952. The electroforming operation is performed by impressing an electrical signal across base region 46 and whisker element 64. The heat generated at the contact point during the electroforming operation in turn causes indium atoms from the whisker element to fuse with the adjacent portion of base region 46 and thereby produce the acceptor-impurity-doped P-type emitter region 62.

In addition to implementing the formation of the emitter region, whisker element 64 subsequently provides a good ohmic connection to the emitter region and thus constitutes the emitter electrode of transistor 60. Thereafter, a collector electrode 66 and a base electrode 68 may be ohmically affixed to collector region 44 and base region 46, respectively, in any of several manners known to the art. For example, as shown in Fig. 5, collector electrode 66 may be affixed to the collector region with an acceptor-impurity-doped solder 69, while the ohmic connection between electrode 68 and N-type base region 46 may be produced by employing as the base electrode a donor-impurity-doped wire or whisker element, for example, and electroforming or welding the electrode to the base region. Owing to the fact that the impedance of the base region is relatively low and the fact that electrodes 64 and 68 are the base and emitter electrodes, and not the collector and emitter electrodes as in a point-contact transistor, the spacing of the electrodes has no particular significance.

It may be recalled that N-P-N junction transistors may also be produced according to the methods of this invention by merely utilizing an N-type germanium starting specimen and by creating a P-type regrown base region with an alloy pellet, including an acceptor impurity. If this procedure is employed, the N-type emitter region 62 may be formed by utilizing a donor-impurity-doped whisker element for the emitter electrode. Similarly, if a whisker-element base electrode is employed, it should include an acceptor impurity to create a nonrectifying connection with the base region. It will also be recognized that for the N-P-N junction transistor the collector electrode is preferably affixed to the collector region with a donor-impurity-doped solder, for example.

The principal advantage of employing a wire base electrode is that fabrication of the transistor is simplified. It should be pointed out, however, that a large-area base electrode may be preferable if the transistor is to be utilized as a high-frequency amplifier, since the frequency response of the transistor is an inverse function, not only of the thickness of the base region but also of the impedance of the base region. In addition, it may be shown that a large-area base electrode permits transistor operation at higher power ratings and provides higher voltage and power gains.

Figure 6:
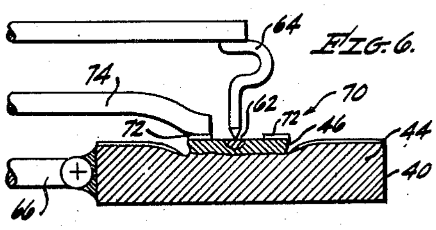
Fig. 6 is a schematic diagram, partly in section, of a modified form of the fused junction transistor shown in Fig. 5.

Referring now to Fig. 6, there is shown a modified form of fused junction transistor, generally designated 70, which is especially suitable for high-frequency applications in the frequency spectrum of several hundred megacycles. Transistor 70 again includes a germanium specimen 40 having a collector region 44 and an emitter region 62 of similar conductivity-type material and separated from each other by a distance of the order of several ten thousandths of an inch by a base region 46 of opposite conductivity-type material. As previously illustrated with regard to Fig. 5, a whisker element 64 is again provided for forming emitter region 62 and for making ohmic contact thereto, while a collector electrode 66 provides an ohmic connection to collector region 44. The principal distinction between transistor 70, as shown in Fig. 6, and the transistor shown in Fig. 5 is that the nonrectifying contact with base region 46 is established through an annular conductive layer 72 of a suitable metal such as gold, for example, which has been deposited about the periphery of the base region and is connected to a base electrode 74, as by solder, for example.

The large-area base contact may be established in any of several manners known to the art, one of which is the preferential etching and evaporation technique disclosed in copending U. S. patent application Serial No. 387,274 for "Junction-Type Semiconductor Devices" by Harvey Stump, filed October 20, 1953. Assuming that this method is employed at the end of the fusion operation, the combination shown in Fig. 3 is first etched, either electrolytically or chemically, to undercut the germanium specimen at the periphery of collector rectifying barrier 48 so that thereafter the periphery of the collector rectifying barrier is overshadowed by the adjacent regrown base region. The alloy button is then removed in a suitable manner, such as by dissolution in a mercury bath as described hereinabove. The center portion of the exposed base region is then masked off, after which conductive layer 72 is evaporated upon the unmasked portion of the base region and that portion of the collector region visible from a point directly above the base region. Owing to the fact that the periphery of the collector rectifying barrier is overshadowed by the periphery of the base region, however, the evaporated atoms of gold are prevented from depositing at the collector junction and thereby short circuiting the rectifying barrier.

After the evaporation step has been carried out, the mask is removed from the center portion of the base region and the emitter P-N junction is formed with whisker element 64, as previously described with regard to Fig. 5. In the meantime, the electrical connection may be effected between the associated base electrode 74 and conductive layer 72 by soldering, as described hereinabove, or by utilizing an electrically conductive thermosetting plastic, such as Dupont #5780 thermosetting gold.

Figure 7:
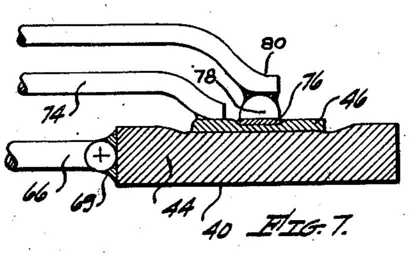
Fig. 7 is a schematic view, partly in section, of a fused junction transistor, according to the invention, in which the base and emitter regions have been formed by sequential fusion operations.

It may be recalled from the description set forth hereinabove, that the emitter P-N junction may also be created by a second fusion operation wherein a second alloy pellet is utilized to produce a regrown emitter region from the previously regrown base region. With reference now to Fig. 7, there is shown another embodiment of a fused junction transistor, according to the invention, in which a relatively large emitter region 76 has been created by fusing to the base region an alloy pellet including an active impurity of the type opposite to that employed in creating the base region. As illustrated in Fig. 7, base region 46, collector region 44, and their associated electrodes 74 and 66, respectively, are substantially identical with the corresponding elements in Fig. 6. Accordingly, further description of these specific elements is considered unnecessary.

Regrown emitter regions may be created in either of two manners. Firstly, as illustrated by Fig. 7, an alloy pellet, including an active impurity of the proper class and a suitable solvent metal, may be placed in the center of regrown base region 46 and heated to a value of temperature whereat the alloy pellet melts and dissolves only the immediate adjacent portion of the base region. After the alloy pellet has alloyed with the adjacent portion of the base region, the combination is cooled to precipitate onto the base region the dissolved germanium together with substituted atoms of the active impurity in the alloy, thereby creating a regrown emitter region, the conductivity type of which is opposite to the conductivity type of the base region. When substantially all of the dissolved germanium has been redeposited on the base region, the remainder of the alloy pellet solidifies out atop the newly regrown emitter region as an alloy button 78, as illustrated in Fig. 7. Button 78 may thereafter be employed for providing a non-rectifying connection between an associated emitter electrode 80 and the regrown emitter region.

According to another process which may be employed in producing fused junction transistors according to the invention, either the base region, the emitter region, or both may be created by utilizing alloy pellets which have been presaturated with germanium at a predetermined temperature. If this process is employed for creating both a regrown base region and a regrown emitter region, for example, two sequential fusion operations are carried out at temperatures only slightly above the temperature of presaturation of the pellets so that after the pellets are melted they do little more than wet the surface of the adjacent germanium specimen and penetrate but slightly into its bulk. As the specimen is then cooled, the germanium included in the presaturated alloy pellets is precipitated onto the adjacent germanium crystal specimen and regrown regions are created in which substantially all of the germanium present has been derived from the alloy pellets. It may be shown that the average penetration of the presaturated alloy pellets during the fusion process is approximately the same as the average radius of the individual germanium crystals in the presaturated pellet. Accordingly, the depth of penetration can be controlled by controlling the size of the germanium crystals in the pellet. If relatively slight penetration is desired, presaturated alloy pellets including relatively minute germanium crystals may be prepared by forcing the completely melted alloy through a small orifice and quenching the resulting droplets in oil.

Figure 8:
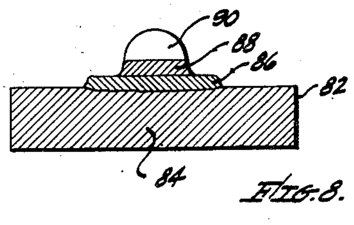
Fig. 8 is a sectional view of a modified form of the transistor shown in Fig. 7.

Referring now to Fig. 8, there is shown a germanium crystal specimen 82 which has been produced by this process and which includes a collector region 84, a regrown base region 86, and a regrown emitter region 88. Assuming that the emitter and collector regions are N-type material and that the base region is P-type material, the base region is first created on the collector region by fusing therewith a germanium-presaturated alloy pellet, including a solvent metal and an acceptor impurity. The alloy button which freezes out at the end of the fusion operation is then dissolved, after which emitter region 88 and an associated alloy button 90 are produced by fusing to the base region a second germanium-presaturated alloy pellet, including a solvent metal and a donor impurity. Alloy button 90 may then be removed, if desired, although it is preferably employed to provide a good ohmic contact with the regrown emitter region.

As previously pointed out, the thickness of the base region in each of the various embodiments of the invention is precisely controllable and may be made as thin as a fraction of a mil. In addition, the carrier lifetime, impurity concentration, and crystal formation of the regrown base regions may be regulated to conform to preselected values. Consequently, the high-frequency fused junction transistors of the invention are readily reproducible.

It should also be pointed out that although the foregoing description of the invention discloses emitter junctions created by either electroforming a whisker element with the base region, or by fusing an alloy pellet to the base region, the emitter junction may also be formed by depositing a suitable active impurity over a portion of the regrown base region. For example, a P-type emitter region may be created on an N-type regrown base region by plating or evaporating a layer of indium or similar metal over the central portion of the regrown base. It should be understood, of course, that still other modifications or alterations may be made in the fused junction transistors of the present invention without departing from the spirit and scope of the invention. For example, various techniques may be utilized for converting the associated transistor electrodes to their respective regions. Accordingly, the invention should be limited only by the appended claims.

What is claimed as new is:

1. The method of producing a fused junction N-P-N transistor which comprises the steps of: fusing a first alloy pellet, including an acceptor impurity, to an N-type monatomic semiconductor specimen to convert a region of the specimen to a regrown P-type base region having an alloy button protruding therefrom; dissolving the alloy button off said base region to expose the surface of said base region; etching the surface of said base region; and fusing a second alloy pellet, including a donor impurity, to said base region to reconvert a portion of said base region to an N-type region.

2. The method of producing a fused junction P-N-P transistor which comprises the steps of: fusing a first alloy pellet, including a donor impurity, to a P-type monatomic semiconductor specimen to convert a portion of the specimen to a regrown N-type base region having an alloy button protruding therefrom; dissolving the alloy button off said base region to expose the surface of said base region; etching the surface of said base region; and fusing a second alloy pellet, including an acceptor impurity, to said base region to reconvert a portion of said base region to a P-type region.

3. The method of preparing a fused junction semiconductor translating device from an active-impurity-doped monatomic crystallographically-oriented semiconductor starting crystal of predetermined conductivity type, said method including the steps of: placing an alloy pellet including an active impurity of the type opposite to that which determines the predetermined conductivity type of the crystal in contact with a predetermined crystallographic surface plane of the crystal; heating the alloy and crystal to a predetermined temperature above the melting point of the alloy but below the melting point of the crystal to melt the alloy pellet and dissolve therein the adjacent region of the crystal; cooling the alloy and the crystal at a predetermined rate to regrow onto the crystal at least a portion of the dissolved crystal together with atoms of the active impurity from the alloy pellet, thereby creating a regrown region of the opposite conductivity type from that of the crystal; further cooling the alloy and the crystal to solidify the remainder of the alloy pellet as an alloy button adjacent the regrown region; removing the alloy button from the regrown region to expose the surface of the regrown region; contacting a whisker element including an active impurity which determines the conductivity type of the crystal with a portion of the regrown region; and passing an electrical current through the combination of the whisker element and the regrown region to fuse said atoms of the active impurity which determines the conductivity type of the crystal with said portion of the regrown region adjacent the point of contact of said whisker element with said portion of the regrown region, thereby forming a junction within said regrown region by reconverting a portion of the regrown region to the predetermined conductivity type of the crystal.

4. The method of preparing a fused junction semiconductor translating device from an active impurity-doped monatomic crystallographically-oriented semiconductor starting crystal of predetermined conductivity type, said method including the steps of: placing an alloy pellet including an active impurity of the type opposite to that which determines the predetermined conductivity type of the crystal in contact with a predetermined crystallographic surface plane of the crystal; heating the alloy and crystal to a predetermined temperature above the melting point of the alloy but below the melting point of the crystal to melt the alloy pellet and dissolve therein the adjacent region of the crystal; cooling the alloy and the crystal at a predetermined rate to regrow onto the crystal at least a portion of the dissolved crystal together with atoms of the active impurity from the pellet, thereby creating a regrown region of the opposite conductivity type from that of the crystal; further cooling the alloy and the crystal to solidify the remainder of the alloy pellet as an alloy button adjacent the regrown region; removing the alloy button from the regrown region to expose the surface of the regrown region; placing a second alloy pellet including an active impurity which determines the conductivity type of the crystal in contact with a portion of the regrown region; heating the assembly comprising the second pellet, the crystal and the regrown region to a predetermined temperature above the melting point of the second alloy pellet but below the melting point of said assembly to melt the alloy pellet and dissolve therein the adjacent portion of the regrown region; and cooling the second alloy pellet and said assembly at a predetermined rate to regrow onto the previously regrown region at least a fraction of the dissolved portion of the regrown region together with atoms of the active impurity from the second pellet, thereby creating a second regrown region in the previously regrown region by reconverting a portion of the previously regrown region to the predetermined conductivity type of the crystal.

References Cited in the file of this patent

UNITED STATES PATENTS

| | | |
|---|---|---|
| 2,505,633 | Whaley | Apr. 25, 1950 |
| 2,561,411 | Pfann | July 24, 1951 |
| 2,623,102 | Shockley | Dec. 23, 1952 |
| 2,623,105 | Shockley et al. | Dec. 23, 1952 |
| 2,644,852 | Dunlap | July 7, 1953 |
| 2,701,326 | Pfann | Feb. 1, 1955 |
| 2,725,315 | Fuller | Nov. 29, 1955 |

OTHER REFERENCES

Proceedings of the Institute of Radio Engineers, vol. 40, No. 11, November 1952. Pages 1341–1342. Article by Armstrong.

Electronics, October 1953, pages 130–134. Article by Fahnestock.